(12) United States Patent
Otani et al.

(10) Patent No.: US 7,279,942 B2
(45) Date of Patent: Oct. 9, 2007

(54) DIFFERENTIAL CURRENT OUTPUT UNIT

(75) Inventors: Kenji Otani, Kyoto (JP); Norio Fujii, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 204 days.

(21) Appl. No.: 11/227,039

(22) Filed: Sep. 14, 2005

(65) Prior Publication Data
US 2006/0006910 A1 Jan. 12, 2006

Related U.S. Application Data

(62) Division of application No. 10/828,373, filed on Apr. 19, 2004, now Pat. No. 6,977,535.

(30) Foreign Application Priority Data
Apr. 25, 2003 (JP) ............................. 2003-121152

(51) Int. Cl.
H03K 3/00 (2006.01)
(52) U.S. Cl. ........................................ 327/112; 326/82
(58) Field of Classification Search ................ 327/108, 327/112; 330/262, 267, 268; 326/82, 87
See application file for complete search history.

(56) References Cited

U.S. PATENT DOCUMENTS 5,818,269 A  10/1998  Brown et al. ................ 327/108

6,977,535 B2 * 12/2005 Otani et al. .................. 327/112

FOREIGN PATENT DOCUMENTS

| JP | 05-328785 | 12/1993 |
| JP | 06-030573 | 2/1994 |
| JP | 07-255191 | 10/1995 |

\* cited by examiner

Primary Examiner—Kenneth B. Wells
(74) Attorney, Agent, or Firm—Hogan & Hartson LLP

(57) ABSTRACT

The invention provides a differential current output unit that has a least number of capacitors and a minimized chip area on one hand, and on the other hand that is capable of providing a smoothly varying output current across a zero-crossing point in accord with an inputted difference input voltage. To do this, the differential current output unit is entirely formed of differential circuits and current mirror circuits having predetermined current mirror ratios. Thus, the unit has a stable output current characteristic. The unit has an inflow output transistor circuit and an outflow output transistor circuit that are operably separated by a delivery circuit. Thus, no penetration current will flow through the inflow- and outflow-output transistor circuits.

6 Claims, 5 Drawing Sheets

DIFFERENTIAL CURRENT OUTPUT UNIT

This is a divisional of application Ser. No. 10/828,373, filed Apr. 19, 2004, now U.S. Pat. No. 6,977,535, which application is hereby incorporated by reference in its entirety.

FIELD OF THE INVENTION

The invention relates to a differential current output unit for supplying an output current to a load in accordance with an input differential voltage inputted to the unit.

BACKGROUND OF THE INVENTION

It is often the case that a load such as an electric motor is driven by an output current in accord with the polarity and the magnitude of a differential input voltage. An example of such motor is a single-phase electric motor for driving a fan, a voice coil electric motor (VCM) of a hard disk drive (HDD), and a dc motor for driving a VTR, a CD-ROM, and a DVD drive.

Some of them are controlled by a signal or signals controlling on-off operation of the output transistors of the drive circuit of the motor based on the comparison of the input voltage with a reference voltage. This type of drive circuit, however, has a drawback in that the output current sharply changes across the point where the polarity of the output current changes (or zero-crossing point), and generates big noise. Furthermore, an inflow transistor circuit and an outflow transistor circuit of the drive circuit can be simultaneously turned on to allow a so-called huge penetration current to flow, and hence requires a delay circuit to circumvent the penetration current.

In order to circumvent such sharp change in the output current by smoothly switching the polarity of the output current across the zero-crossing point, an operational amplifier may be used to control the output current of the power amplifier circuit of a drive circuit. (See, for example literature 1; Masaomi Suzuki, "Standard Textbook: Designing Transistor Circuits", 13th edition, CQ Publishing Co., Jul. 1, 1998, p. 315, FIG. 27.)

However, a drive circuit utilizing an operational amplifier not only has a complicated circuit configuration but also requires extra phase compensation capacitors. Since the drive circuit is usually built in on an IC chip, the chip must have a large area for the phase compensation capacitors. This raises the production cost of the drive circuit.

SUMMARY OF THE INVENTION

It is, therefore, an object of the invention to provide a differential current output unit having a simplified circuit structure involving a minimum number of capacitors and a minimum chip area, yet capable of smoothly changing its output current in accordance with the change in an inputted differential input voltage.

It is another object of the invention to provide a differential current output unit for providing an output current in a stable manner, affected only negligibly by changes in current amplification factors of transistors due to, for example, a change in temperature.

A differential current output unit of the invention comprises:

a difference input circuit 10 that includes
a first constant current source Q17 for providing a first constant current I0,
a first and a second differential amplification transistors Q15 and Q16, respectively, for amplifying an inputted differential input voltage Vin so as to distribute the first constant current I0 among the differential amplification transistors,
a first current mirror source transistor Q11 for generating a first voltage (referred to as first mirror source voltage) i proportional to a first current I1 flowing through the first differential amplification transistor Q15, and
a second current mirror source transistor Q13 for generating a second voltage (referred to as second mirror source voltage) ii proportional to a second current I2 flowing through the second differential amplification transistor Q16;
a current subtraction circuit 20 that includes
a first mirror transistor (referred to as first mirror target transistor) Q22 for flowing therethrough a first mirror current M*I1 that is M times the first current I1 in response to the first mirror source voltage i, with M being a first predetermined mirror ratio, and
a second mirror transistor (referred to as second mirror target transistor) Q21 for flowing therethrough a second mirror current M*I2 that is M times the second current I2 in response to the second mirror source voltage ii,
wherein the subtraction circuit is adapted to output a difference current M*I1−M*I2 that is the difference between the first mirror current M*I1 and second mirror current M*I2;
a delivery circuit 30 for generating current output instruction signals vi-ix in accord with the magnitude of the difference current M*I1−M*I2 and for delivering the current output instruction signals in accord with the polarity of the difference current M*I1−M*I2; and
a current output circuit 40 having a multiplicity of output transistor circuits 40-1-40-4 each including a third mirror source transistor that is enabled by one of the current output instruction signals and a third mirror target transistor for flowing therethrough an output current that is N times the current flowing through the third mirror source transistor, with N being a second predetermined mirror ratio, wherein the current output circuit 40 is adapted to supply an output current Iout to a load 70 in a positive or a negative direction in accord with the polarity and the magnitude of the current output instruction signals.

The differential current output unit may have a current level setting circuit 60 for controlling the current level I0 of the first constant current source Q17.

In the current subtraction circuit 20, the first mirror target transistor Q22 may be serially connected at a node to a second constant current source Q24 supplying a second constant current M*I0/2 so as to output a first difference current from the node in accord with the difference current M*I1−M*I2, and the second mirror target transistor Q21 may be serially connected at a node to a third current source Q23 supplying the second constant current M*I0/2 so as to output from the node a second difference current M*I2−M*I1 having opposite polarity with respect to the first difference current M*I1−M*I2.

The differential current output unit may be provided with a current level setting circuit 60 for simultaneously controlling the current levels of the first, second, and third constant current sources Q17, Q24, and Q23, respectively, by the same ratio.

The current subtraction circuit 20A may be modified to include
a first mirror target transistor Q21a for flowing therethrough the first mirror current M*I1 connected in series with a first subtraction transistor Q24a for flowing therethrough a current M*I2 that is M times the second current I2 in accord with the second mirror source voltage ii to thereby output from the node a first difference current in accord with the difference current M*I1−M*I2, and a second mirror target transistor Q26a for flowing therethrough the second mirror current M*I2 connected in series with a second subtraction transistor Q29a for flowing therethrough a current M*I1 that is M times the first current I1 in accord with the first mirror source voltage i to thereby output from the node of these transistors a second difference current M*I2−M*I1 of opposite polarity with respect to the first difference current M*I1−M*I2, wherein M is the second mirror ratio.

The delivery circuit 30 may include:

a first delivery transistor circuit Q32 and a second delivery transistor circuit Q33 for respectively outputting a current output instruction signal that is controlled in accordance with the difference current M*I1−M*I2 when the difference current has negative polarity; and a third delivery transistor circuit Q31 and a fourth delivery transistor circuit Q34 for respectively outputting a current output instruction signal that is controlled in accordance with the difference current M*I1−M*I2 when the difference current has positive polarity.

The current output circuit 40 may include:

a first output transistor circuit 40-1 for flowing therethrough an output current in response to a current output instruction signal vii received from the first delivery transistor circuit Q32;

a second output transistor circuit 40-2 for flowing therethrough an output current in response to a current output instruction signal viii received from the second delivery transistor circuit Q33;

a third output transistor circuit 40-3 for flowing therethrough an output current in response to a current output instruction signal vi received from the third delivery transistor circuit Q31; and a fourth output transistor circuit 40-4 for flowing therethrough an output current in response to a current output instruction signal ix received from the fourth delivery transistor circuit Q34, wherein the current output circuit 40 is adapted to establish a first load current path for flowing the output current of the first output transistor circuit 40-1 to an external load and flowing the output current of the second transistor circuit 40-2 from the external load, and a second load current path, opposite in direction with respect to the first current path, for flowing out the output current of the third output transistor circuit 40-3 to the external load and flowing in the output current of the fourth output transistor circuit 40-4 from the external load.

Each of the first through fourth output transistor circuits 40-1-40-4, respectively, may include a mirror source transistor controlled by respective current output instruction signals received from the delivery circuit 30, and a mirror target transistor for flowing therethrough a current that is N times the current flowing through the mirror source transistor, where N is the second predetermined mirror ratio.

The first and third output transistor circuits 40-1 and 40-3, respectively, may include a mirror source transistor controlled by respective one of current output instruction signals vii and vi received from the delivery circuit 30 and a mirror target transistor for flowing therethrough a current that is N times the current flowing through the mirror source transistor, wherein N is the second mirror ratio. The second and fourth output transistor circuits 40-2 and 40-4, respectively, may include a mirror source transistor controlled by a respective one of current output instruction signals viii and ix received from the delivery circuit 30 and a mirror target transistor for flowing therethrough a current that is N×α times the current flowing through this mirror source transistor, wherein N is the second mirror ratio and α is an arbitrary number other than 1.

Each of the first through fourth output transistor circuits 40-1-40-4, respectively, may have a first current mirror circuit having a fourth predetermined mirror ratio Q and being controlled by a respective current output instruction signal received from the delivery circuit 30, and a second current mirror circuit having a fifth predetermined mirror ratio P and being controlled by the output current of the first current mirror circuit.

Since a differential current output unit of the invention uses no operational amplifier and fewer capacitors, the unit has a simplified circuit structure that can be formed on a smaller chip area.

Moreover, smooth zero-point crossing of the output current is secured, since the output current changes to accurately follow the input voltage, thereby resulting in reduced noise.

Moreover, since a delivery circuit is used to separate the inflow- and outflow-transistor circuits, no penetration current will flow through the inflow- and outflow-output transistor circuits, thereby advantageously preventing destruction of the output transistors due to penetration current and reducing the power loss.

Still further, since the current level of the output transistor circuits can be controlled by controlling the common emitter current level (i.e. constant current level) of the difference input circuit, the level of the output current can be easily adjusted.

In addition, since the differential current output unit of the invention is entirely formed of differential circuits and current mirror circuits having predetermined mirror ratios, current output characteristics of the unit are little affected by a change in, for example, current gain hfe of a transistor involved.

DETAILED DESCRIPTION OF THE PREFERRED EMBODIMENTS

Figure 1:
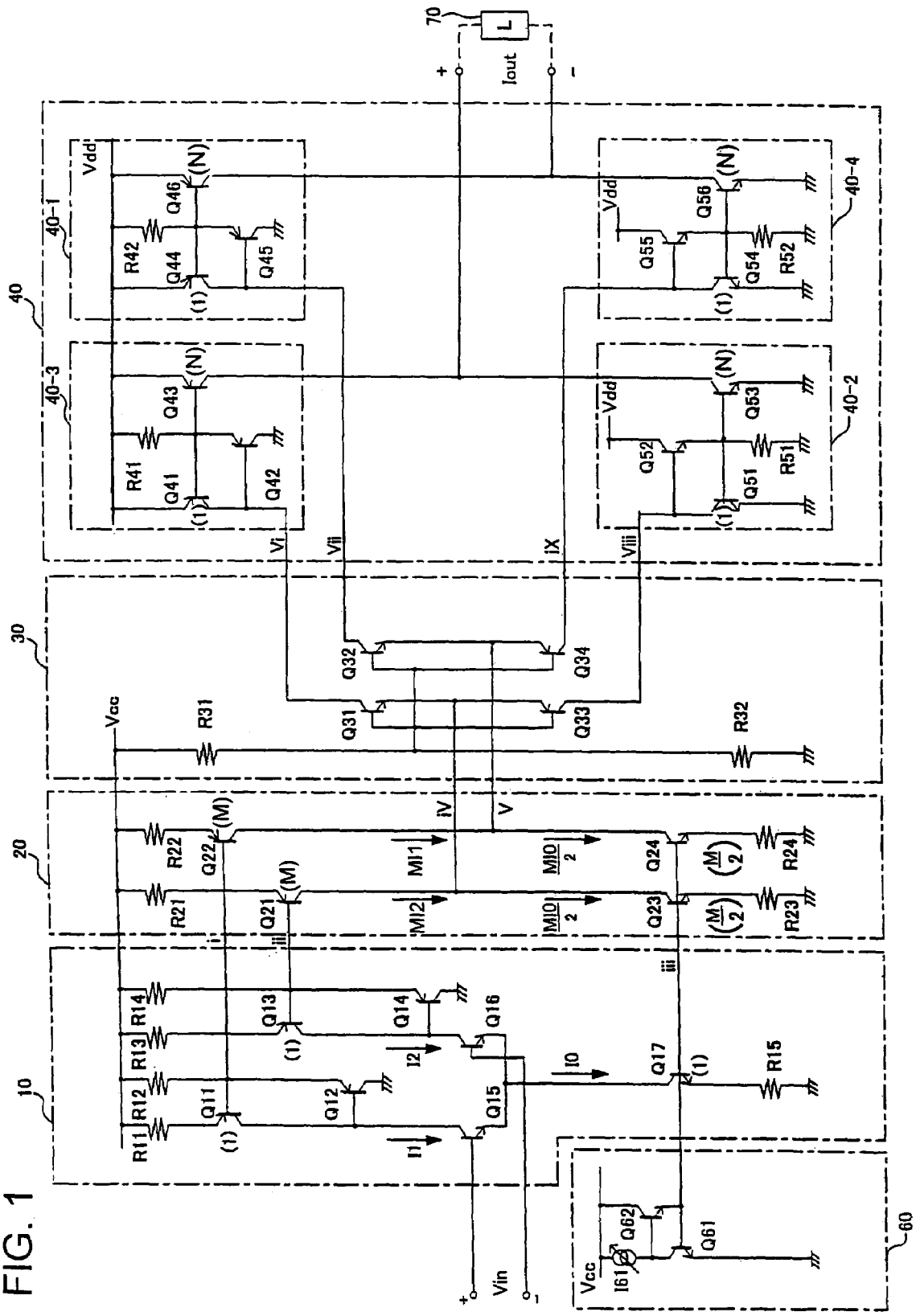
FIG. 1 is a schematic circuit diagram of a differential current output unit in accordance with a first embodiment of the invention.
Figure 2:
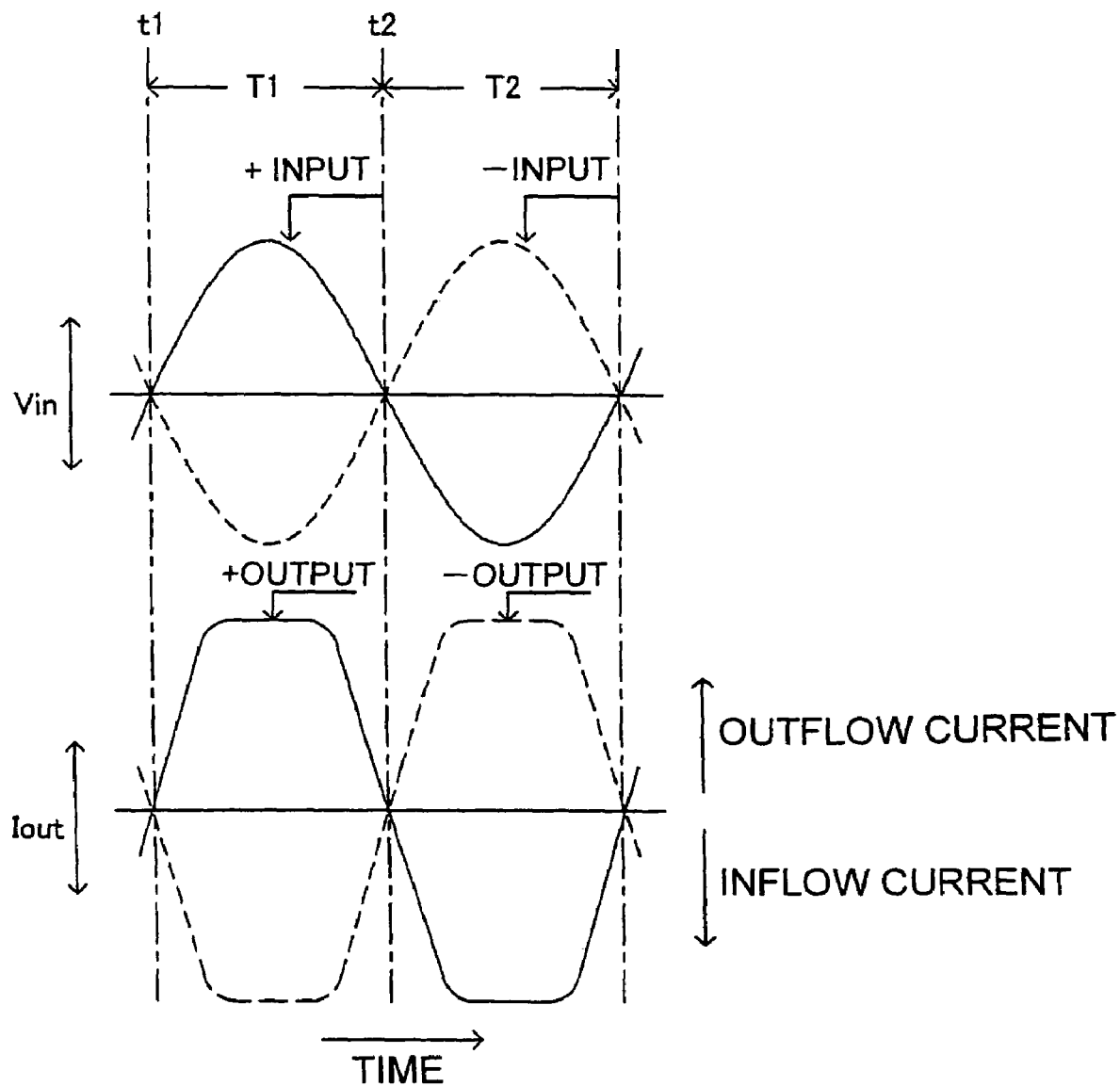
FIG. 2 is a circuit diagram illustrating the operation of the differential current output unit of FIG. 1.

Referring to the accompanying drawings, embodiments of the invention will now be described in detail with reference to a differential current output unit. FIG. 1 shows a circuit structure of a differential current output unit in accordance with a first embodiment of the invention. FIG. 2 shows a diagram describing the operation of the differential current output unit of FIG. 1.

As shown in FIG. 1, a difference input circuit 10 of the differential current output unit is supplied with an input voltage Vin. A series connection of an NPN type bipolar transistor (hereinafter referred to as NPN transistor) Q17 and a resistor R15 forms a first constant current source. This first constant current source provides a first constant current I0 in response to a current level setting signal iii. The emitters of a first NPN transistor Q15 and a second NPN transistor Q16 for differential amplification of the input are connected together with this first constant current source. The input voltage Vin is applied between the bases of these transistors Q15 and Q16. The transistors Q15 and Q16 together differentially amplify the input voltage Vin so as to distribute the first constant current I0 among the transistors Q15 and Q16. As a consequence, a first current I1 flows through the NPN transistor Q15, and a second current I2 flows through the NPN transistor Q16.

Connected between the collector of the NPN transistor Q15 and a power supply voltage Vcc is a series connection of a resistor R11 and a PNP type bipolar transistor (hereinafter referred to as PNP transistor) Q11 serving as a first mirror source transistor. There are provided a PNP transistor Q12 having an emitter connected to the base of the PNP transistor Q11 and a base connected to the collector of the PNP transistor Q11 and a collector connected to the ground, and a resistor R12 connected between the base of the PNP transistor Q11 and the power supply voltage Vcc.

In this arrangement, the first current I1 flows via the series connection of the PNP transistor Q11 and resistor R11, and a first mirror source voltage i proportional to the first current I1 is generated at the base of the PNP transistor Q11. In what follows, voltages will be referenced to the ground potential unless otherwise stated.

Connected between the collector of the NPN transistor Q16 and the power supply voltage Vcc is a series connection of a resistor R13 and a PNP transistor Q13 serving as a second mirror source transistor. Further, there is provided a PNP transistor Q14 having an emitter connected to the base of the PNP transistor Q13, a base connected to the collector of the PNP transistor Q13, and a grounded collector and a resistor R14 connected between the power supply voltage Vcc and the base of the PNP transistor Q13. In this arrangement, the second current I2 flows via the series connection circuit of the PNP transistor Q13 and the resistor R13, and a second mirror source voltage ii proportional to The second current I2 is generated at the base of the PNP transistor Q13.

A current subtraction circuit 20 includes a series connection of a resistor R22, a first mirror transistor (referred to as first mirror target transistor) in the form of a PNP transistor Q22 for flowing therethrough a first mirror current $M*I1$ that is M times the first current I1 in response to the first mirror source voltage i with M being a first predetermined mirror ratio, a second constant current source in the form of an NPN transistor Q24 for flowing therethrough a second constant current $M*I0/2$, and a resistor R24. From the node of the PNP transistor Q22 and the NPN transistor Q24, a current v is outputted in accord with a first difference current $M*I1-M*I2$. The first predetermined mirror ratio M can be set to an arbitrary magnitude.

The current subtraction circuit 20 also includes a series connection of a resistor R21, a second mirror transistor (referred to as second mirror target transistor) in the form of a PNP transistor Q21 for flowing therethrough a second mirror current $M*I2$ that is M times the second current I2 in response to the second mirror source voltage ii with M being the first predetermined mirror ratio, a third current source in the form of an NPN transistor Q23 for flowing therethrough the second constant current $M*I0/2$, and a resistor R23. From the node of the PNP transistor Q21 and the NPN transistor Q23, a second current iv is outputted in accord with a second difference current $M*I2-M*I1$ having a polarity opposite to that of the first difference current.

The NPN transistors Q23 and Q24 have a current ratio of M/2 that of the NPN transistor Q17. By varying the voltage iii supplied to the respective bases of the NPN transistors Q23, Q24 and Q17 using a current level setting circuit 60, levels of the constant current I0 and $M*I0/2$ can be simultaneously controlled by the same ratio.

The current level setting circuit 60 comprises a variable current source I61 connected between the power supply voltage Vcc and the ground, an NPN transistor Q61, and an NPN transistor Q62 having an emitter connected to the base of the NPN transistor Q61, a base connected to the collector of the NPN transistor 61, and a collector connected to the power supply voltage Vcc. The base of the NPN transistor Q61 is connected to the respective bases of the NPN transistors Q23, Q24, and Q17. By varying the current level of the variable current source I61, the base voltage of the NPN transistor Q61 can be controlled. The constant currents through the respective NPN transistors Q23, Q24, and Q17 forming a current mirror configuration can be controlled by controlling the base voltage iii of these NPN transistors.

A delivery circuit 30 includes: an NPN transistor Q32 serving as a first delivery transistor; an PNP transistor Q33 serving as a second delivery transistor; an NPN transistor Q31 serving as a third delivery transistor; a PNP transistor Q34 serving as a fourth delivery transistor; and voltage dividing resistors R31 and R32 for dividing the power supply voltage Vcc to generate at the voltage division node thereof a predetermined divided voltage.

The divided voltage is preferably equal to the output voltage of the current subtraction circuit 20 when the first difference current $M*I1-M*I2$ (and the second difference current $M*I2-M*I1$ as well) is zero.

The bases of the first through fourth delivery transistors Q32, Q33, Q31, and Q34, respectively, are connected to the voltage division node. A current v in accord with the first difference current $M*I1-M*I2$ is supplied to the emitters of the first and the fourth delivery transistors Q32 and Q34, respectively.

A current iv in accord with the second difference current $M*I2-M*I1$ is supplied to the emitters of the second and the third delivery transistors Q33 and Q31, respectively.

First through fourth current output instruction signals (that is, first through fourth current levels) vi-ix are outputted from the respective first through fourth delivery transistors Q32, Q33, Q31, and Q34, respectively, in accord with the polarities and magnitudes of the currents v and iv.

A current output circuit 40 includes: a first output transistor circuit 40-1 for flowing therethrough an output current in accord with the current output instruction signal vii received from the NPN transistor Q32; a second output transistor circuit 40-2 for flowing therethrough an output current in accord with the current output instruction signal viii received from the PNP transistor Q33; a third output transistor circuit 40-3 for flowing therethrough an output current in accord with the current output instruction signal vi received from the NPN transistor Q31a; and fourth output transistor circuit 40-4 for flowing therethrough an output current in accord with-the current output instruction signal ix received from the PNP transistor Q34.

The first output transistor circuit 40-1 has a PNP transistor Q44 serving as a third mirror source transistor connected between the collector of the NPN transistor Q32 and the power supply voltage Vdd. The first output transistor circuit 40-1 also has a PNP transistor Q45 having an emitter connected to the base of the PNP transistor Q44 and a base connected to the collector of the PNP transistor Q44, and a collector connected to the ground, and a resistor R42 connected between the base of the PNP transistor Q44 and power supply voltage Vdd.

In this arrangement, the current output instruction signal vii flows via the PNP transistor Q44, resulting in a third mirror source voltage proportional to the current output instruction signal vii at the base of the PNP transistor Q44. In response to the third mirror source voltage, a third mirror current N*vii that is N time the second current output instruction signal vii flows through a PNP transistor Q46 serving as a third mirror target transistor, with N being the second predetermined mirror ratio. The third mirror current is outputted as a differential output load current Iout to a load 70. The second predetermined mirror ratio N can be set to an arbitrary magnitude. N is preferably not less than 1.

The second output transistor circuit 40-2 has an NPN transistor Q51 serving as a third mirror source transistor connected between the collector of the PNP transistor Q33 and the ground. The second output transistor circuit 40-2 also has an NPN transistor Q52 having an emitter connected to the base of the NPN transistor Q51, a base connected to the collector of the NPN transistor Q51, and a collector connected to the power supply voltage Vdd, and a resistor R51 connected between the base of the NPN transistor Q51 and the ground.

In this arrangement, the current output instruction signal viii flows via the NPN transistor Q51, resulting in a third mirror source voltage proportional to the current output instruction signal viii at the base of the NPN transistor Q51. The second output transistor circuit 40-2 has a further NPN transistor Q53 serving as a third mirror target transistor, through which a third-mirror current N*viii that is N times the current output instruction signal viii flows in response to the third mirror source voltage, where N is the second predetermined mirror ratio. This current flows into a load 70 as a load current Iout.

The third output transistor circuit 40-3 includes PNP transistors Q41, Q42, and Q43 and a resistor R41 in a configuration similar to that of the first output transistor circuit 40-1. In this arrangement, a third mirror current N*vi that is N times the current output instruction signal vi flows through the PNP transistor Q43, with N being the second predetermined mirror ratio. This current flows into the load 70 as a load current Iout.

The fourth output transistor circuit 40-4 is formed of NPN transistors Q54, Q55, and Q56 and a resistor R52 in a configuration similar to that of the second output transistor circuit 40-2. Because of this arrangement, the third mirror current N*ix that is N times the current output instruction signal ix flows through the NPN transistor Q56, with N being the second predetermined mirror ratio N. This current flows into the load 70 as the load current Iout.

Thus, a first load current path is formed to flow the output current N*vii from the first output transistor circuit 40-1 to the load 70 and flow the output current N*viii from the load 70 to the second output transistor circuit 40-2. A second load current path, opposite in direction to the first, is also formed to flow an output current N*vi from the third output transistor circuit 40-3 to the load 70, and flow an output current ix from the load 70 to the fourth output transistor circuit 40-4.

Referring further to FIG. 2, operation of the differential current output unit of FIG. 1 will now be described.

The first constant current I0 is set to a predetermined level by the current level setting circuit 60. As a consequence, the second constant current becomes M*I0/2, in accord with the current ratio of M/2.

When the input voltage Vin is zero at time t1 as shown in FIG. 2, the first current I1 and the second current I2 are equal in magnitude, so that both the first mirror current M*I1 and the second mirror current M*I2 are equal to M*I0/2. As a consequence, since the difference currents iv and v are zero, all the current output instruction signals vi-ix are zero, resulting in no load current Iout.

When the input voltage Vin is positive at the (+) input terminal of the difference input circuit 10 and negative at the (−) input terminal thereof during a period T1 as shown in FIG. 2, the first current I1 is larger than the second current I2 in accord with the magnitude of Vin. The first and the second current I1 and I2, respectively, are correctly converted by the first mirror ratio M. Thus, the first mirror current M*I1 is larger than the second mirror current M*I2 (i.e. M*I1−M*I2>0) In this case, since the difference current v equals M*I1−M*I0/2 which is negative, a current of (M*I1−M*I2)/2 flows out. Since the difference current iv equals M*I2−M*I0/2 which is positive, a current of (M*I2−M*I1)/2 flows in. That is, the inflow current and outflow current has the same magnitude and opposite directions.

The difference current iv controls on-off operation of the third delivery transistor Q31, supplying the current output instruction signal vi to the third output transistor circuit 40-3. On the other hand, the difference current v controls on-off operation of the fourth delivery transistor Q34, supplying the current output instruction signal ix to the fourth output transistor circuit 40-4.

Accordingly, a current N*vi flows from the PNP transistor Q43 of the third output transistor circuit 40-3 to the load 70 as the positively polarized load current Iout. A current N*ix flows from the load 70 to the NPN transistor Q56 of the fourth output transistor circuit 40-4 as a load current Iout. These outflow and inflow currents are the same in magnitude.

When the input voltage Vin is positive at the (−) input terminal of the difference input circuit 10 and negative at the (+) input terminal thereof during a period T2 as shown in FIG. 2, the second current I2 is larger than the first current I1 both in accord with the magnitude of Vin. In this case, the first mirror current M*I1 is smaller than the second mirror current M*I2, that is, M*I1−M*I2<0. Since the difference current v equals M*I1−M*I0/2<0, a current of (M*I1−M*I2)/2 flows in. Since the difference current iv equals M*I2−M*I0/2>0, a current of (M*I2−M*I1)/2 flows out. That is, the inflow and outflow of currents have the same magnitude and opposite directions.

The difference current v controls on-off operation of the first delivery transistor Q32, supplying the current output instruction signal vii to the first output transistor circuit 40-1. On the other hand, the difference current iv controls on-off operation of the second delivery transistor Q33, supplying the current output instruction signal viii to the second output transistor circuit 40-2.

Accordingly, a current N*vii flows from the PNP transistor Q46 of the output transistor circuit 40-1 to the load 70 as a load current Iout of the negative polarity. Moreover, a current N*viii through the NPN transistor Q53 of the output transistor circuit 40-2 is fed from the load 70 as a load current Iout. These outflow and inflow currents have the same magnitude. The load current Iout is presently assumed to saturate at a predetermined level as shown in FIG. 2. It should be understood, however, that the load current Iout need not to saturate.

Thus, depending on the directions of the difference currents v and iv, either the first delivery transistor Q32 in the outflow section and the second delivery transistor Q33 in the inflow section, or the third delivery transistor Q31 in the outflow section and the fourth delivery transistor Q34 in the inflow section of the delivery circuit 30, are controlled for delivery of current output instruction signals. That is, two separate sets of an inflow and an outflow transistor circuits of the current output circuit are automatically changed over from one to the other by current output instruction signals.

Next, operation of the unit will now be described for a period in which the input voltage Vin changes from positive to negative polarity across zero volt. This is a case where the voltage passes zero point at time t2 between the periods T1 and T2 as shown in FIG. 2.

During the period T1, the third delivery transistor Q31 is controlled by-the difference current iv to supply the current output instruction signal vi to the third output transistor circuit 40-3. At the same time, the fourth delivery transistor Q34 is controlled by the difference current v to supply the current output instruction signal ix to the fourth output transistor circuit 40-4.

The difference currents iv and v have the same polarity as the input voltage Vin and magnitudes exactly proportional to Vin due to the actions of the difference input circuit 10 and the current subtraction circuit 20. As a consequence, as the (positive) input voltage Vin decreases towards zero, the magnitudes and the polarities of the difference currents iv and v also decrease in the same manner. Accordingly, when the input voltage Vin becomes zero, the difference currents iv and v also become zero.

Entering the period T2, the input voltage Vin changes from zero to a negative level, the difference currents iv and v to increase in magnitude with the opposite polarity as compared with the change in the period T1.

Thus, in accordance with the directions and the magnitudes of the difference currents iv and v, separation of the upper and lower (inflow- and outflow-) transistor circuits of the delivery circuit 30 are automatically controlled. Based on the controlled delivery of the current output instruction signals from the delivery circuit 30, smooth inflow and outflow of the output current of the output transistor circuits 40-1-40-4 are provided. This can be done by supplying a load current Iout in accord with the differential input voltage Vin so as to smoothly change the output current Iout across a zero crossing point of the load current Iout. It will be appreciated that destruction of, the output transistors by a large (penetration) current is prevented by the delivery circuit 30 changing over the upper and lower sections of the current output circuit 40 (i.e. changing over the two sets of outflow and inflow transistor circuits) to prevent simultaneous flow of currents through the inflow and outflow output transistors.

It should be also appreciated that the degree of amplification in terms of the ratio of the load current Iout to the input voltage Vin, that is, amplification factor of the difference current output unit, can be arbitrarily altered by changing the output level of the variable current source I61 of the current level setting circuit 60. The ratio can be easily regulated by simultaneously altering the constant current I0 of the difference input circuit 10 and the constant current M*I0/2 of the current subtraction circuit 20 by the same ratio.

Figure 3:
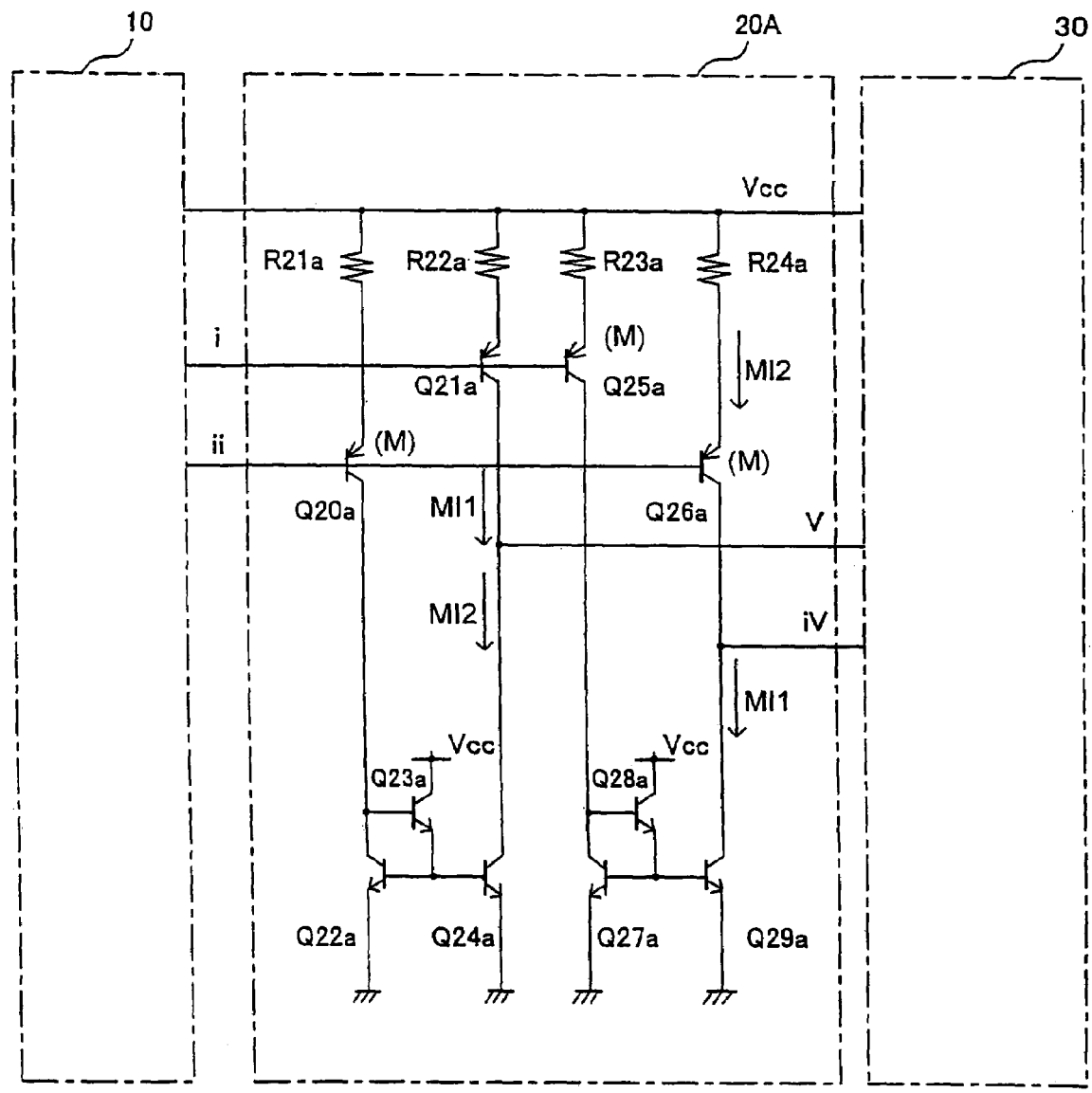
FIG. 3 is schematic circuit diagram of a subtraction circuit for use in the differential current output unit in accordance with a second embodiment of the invention.

Referring to FIG. 3, there is shown another subtraction circuit of the differential current output unit according to a second embodiment of the invention.

As shown in FIG. 3, this current subtraction circuit 20A has a series connection of: a resistor R22a, a PNP transistor Q21a serving as a first mirror source transistor for flowing therethrough a first mirror current M*I1 that is M times the first mirror current I1 in response to the first mirror source voltage, where M is a first predetermined mirror ratio; and an NPN transistor Q24a serving as a first subtraction transistor for flowing therethrough a second mirror current M*I2 that is M times the second current I2 with M being the first predetermined mirror ratio.

In order to obtain the second mirror current M*I2 of the NPN transistor Q24a, the current subtraction circuit is formed to include a resistor R21a, an PNP transistor Q20a for flowing therethrough the second mirror current M*I2 in response to the second mirror source voltage ii; and a current mirror transistor circuit formed of NPN current transistors Q22a and Q23a for flowing the current M*I2 of the PNP transistor Q20a through an NPN transistor Q24a.

The first difference current v of M*I1−M*I2 is outputted from the node of the PNP transistor Q21a and the NPN transistor Q24a.

The differential current output unit 20A also includes a series connection of: a resistor R24a; a PNP transistor Q26a serving as a second mirror target transistor for flowing therethrough the second mirror current M*I2 that is M times the second current I2 in response to the second mirror source voltage ii, with M being the first predetermined mirror ratio; and an NPN transistor Q29a serving as a second subtraction transistor for flowing therethrough the first mirror current M*I1 that is M time the first current I1, with M being the first predetermined mirror ratio.

In order to obtain the first mirror current M*I1 of the NPN transistor Q29a, the differential current output unit 20A includes a resistor R23a, an PNP transistor Q25a for flowing therethrough the first mirror current M*I1 in response to the first mirror source voltage i; and a current mirror transistor circuit formed of NPN transistors Q27a and Q28a for flowing the current M*I1 of the PNP transistor Q25a through an NPN transistor Q29a.

The second difference current iv of M*I2−M*I1 is outputted from the node of the PNP transistor Q26a and the NPN transistor Q29a.

The current subtraction circuit 20A of FIG. 3 functions in the same way as the current subtraction circuit 20 of FIG. 1.

It is noted that in the current subtraction circuit 20A the first difference current v of M*I1−M*I2 and the second difference current iv of M*I2−M*I1 are respectively formed by the same current mirror circuits as the current mirror circuit forming the first and the second mirror source voltages i and ii respectively. Thus, the current subtraction circuit 20A is free of the error that can be otherwise contained in the second constant current of FIG. 1. Hence, the circuit 20A results in more accurate first and second difference currents.

Figure 4:
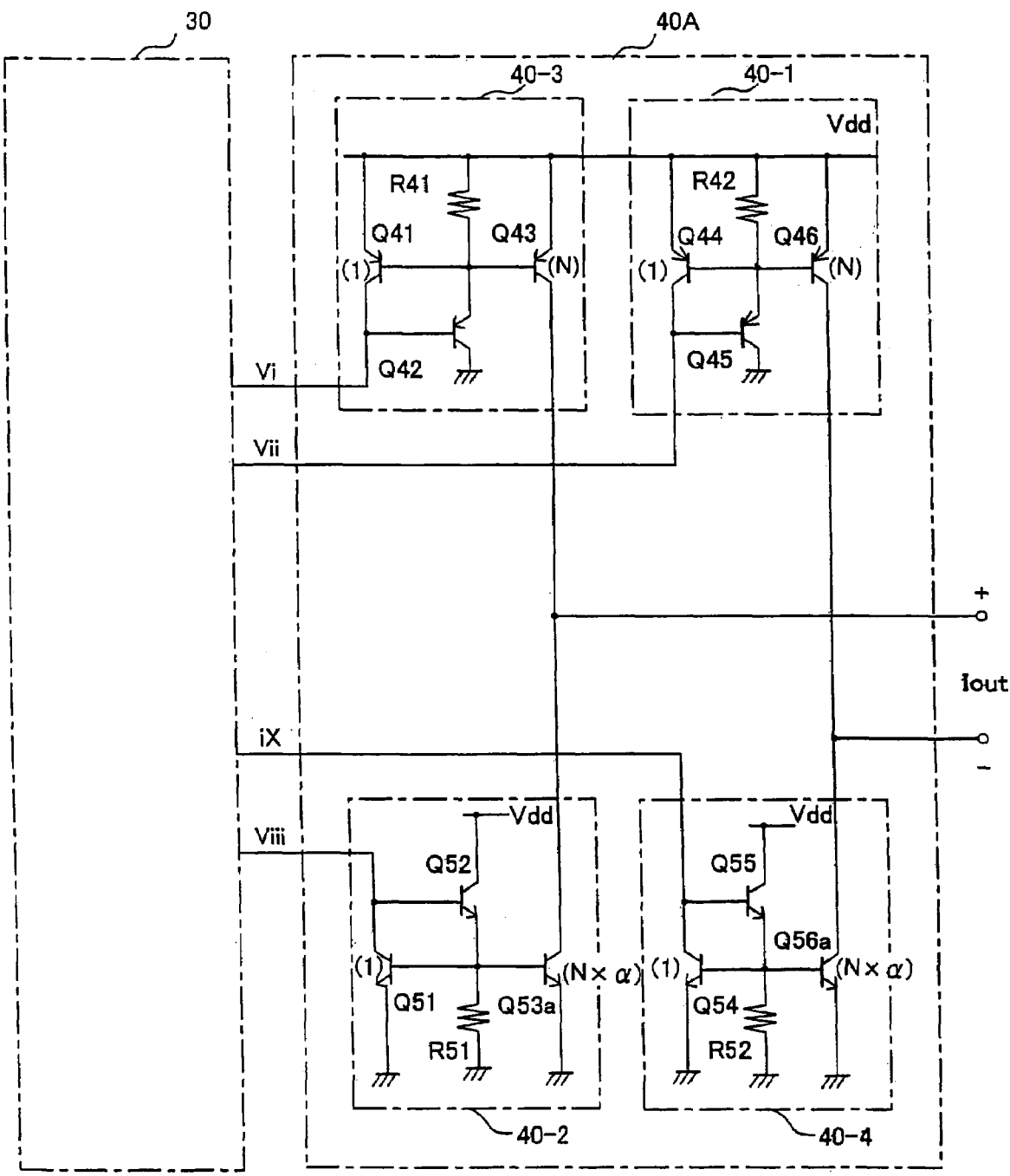
FIG. 4 is a schematic circuit diagram of a current output circuit for use in a differential current output unit in accordance with a third embodiment of the invention.

Referring to FIG. 4, there is shown another a current output circuit 40A of the differential current output unit in accordance with a third embodiment of the invention.

As shown in FIG. 4, current output transistor circuits 40-1-40-4 of the current output circuit 40A has the same circuit arrangement as the current output circuit 40 of FIG. 1. However, current output circuit 40A differs from the circuit 40 in that both the NPN transistor Q53a provided in the inflow section for flowing therethrough the output current of the second output transistor circuit 40-2 and the NPN transistor Q56a provided in the inflow section for flowing therethrough the output current of the fourth output transistor circuit 40-4 have a current mirror ratio of M*α. The factor alpha can be basically any number other than 1.

As an example, we consider a case where α is 1.5. In this case, in the first load current path, the output current N*vii of the first output transistor circuit 40-1 is fed to the load 70, and the output current N*α*viii of the second output transistor circuit 40-2 is fed from the load 70. In this first load current path, the load current Iout becomes equal to the smaller output current N*vii.

On the other hand, in the second output transistor circuit 40-2, the NPN transistor Q53a is controlled to flow a larger output current N*α*viii. As a consequence, the degree of electric conduction becomes higher in the NPN transistor Q53a than in the PNP transistor Q46 of the first output transistor circuit 40-1. Thus, the collector voltage of the NPN transistor Q53a reduces to a mere potential drop across the on-state resistance of the transistor Q53a, which is extremely small. When this is the case, the collector can be regarded as substantially at the ground potential.

The same is true for the load current that is obtained in the second load current path formed by the third output transistor circuit 40-3 and the fourth output transistor circuit 40-4. That is, the collector voltage of the NPN transistor Q56a becomes equal to the negligibly small potential drop across the on-state resistance of the NPN transistor Q56.

Consequently, the load voltage impressed on the load 70 is a ground-based voltage. In this arrangement, even if the impedance balance between the first output transistor circuit 40-1 and the second output transistor circuit 40-2 has collapsed, the load 70 is impressed with the ground based voltage, thereby stabilizing the output voltage. In the same way, the waveform of the output voltage can be stabilized even when the impedance balance between the third output-transistor circuit 40-3 and the fourth output transistor circuit 40-4 has collapsed.

Incidentally, the magnitude of the factor a, can be smaller than 1. In this case, the load 70 is impressed with a voltage based on the power supply voltage Vdd (Vdd-based voltage). Yet, the waveform of the output voltage can be stabilized. In actuality, however, it is appropriate to set the value of α in the range from 1.1 to 1.5 ($1.1 < \alpha < 1.5$) (or in the range from $1/1.5 < \alpha < 1/1.1$), taking account of characteristics of the circuit.

Figure 5:
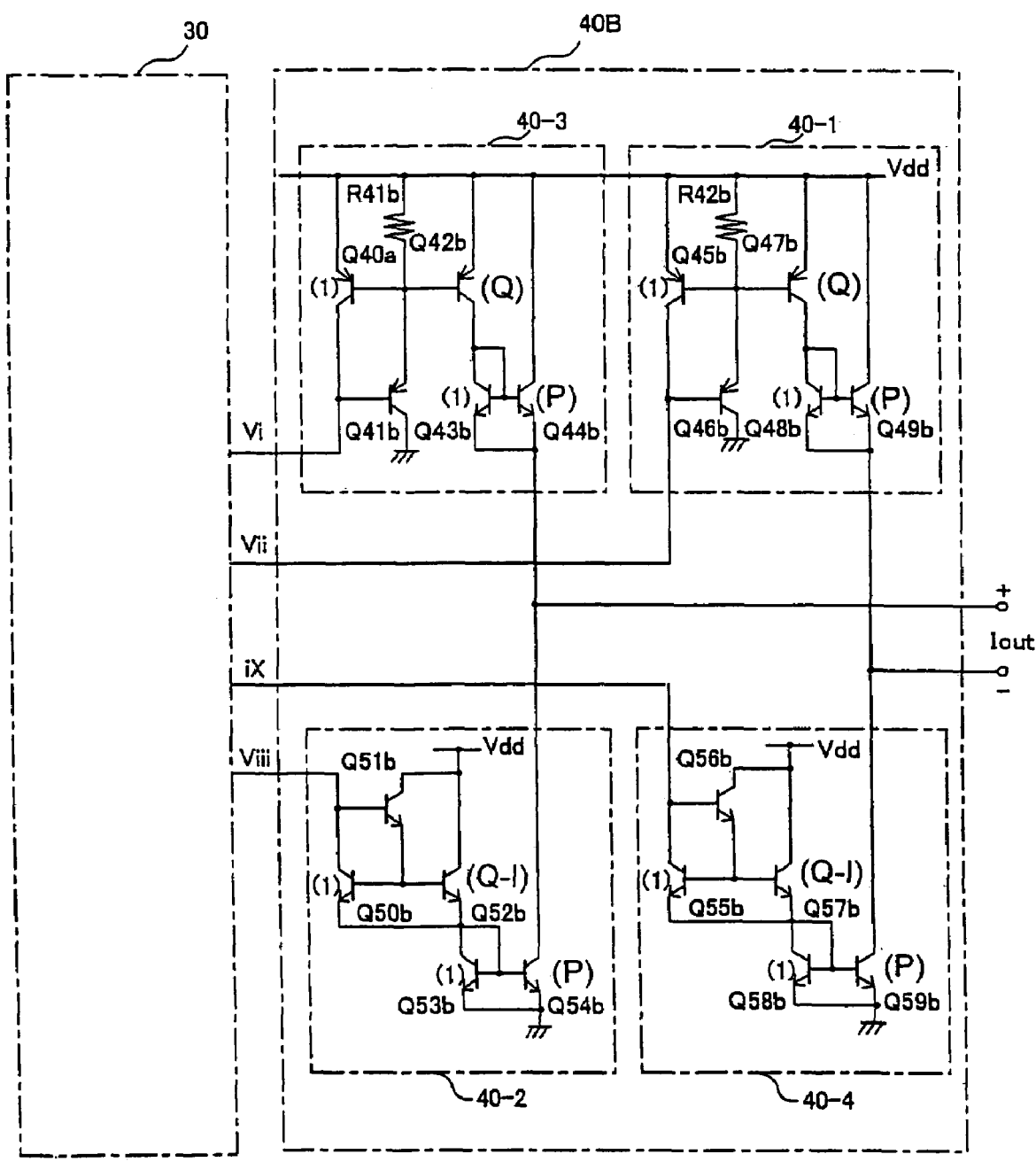
FIG. 5 is a schematic circuit diagram of another current output circuit for use in a differential current output unit in accordance with a fourth embodiment of the invention.

FIG. 5 shows an arrangement of current output circuit of the differential current output unit in accordance with a fourth embodiment of the invention.

As shown in FIG. 5, the current output circuit 40B is provided with first through fourth output transistor circuits 40-1-40-4, respectively, in such a way that each of the output transistor circuits has a first current mirror circuit having a fourth predetermined mirror ratio Q and controlled by a respective one of the current output instruction signals vi, vii, viii, and ix received from the delivery circuit 30, and a second mirror circuit having a fifth predetermined mirror ratio P and controlled by a respective one of the output currents of the first mirror circuits. That is, in the current output circuit 40B, the current mirror ratio N of the current output circuit 40 of FIG. 1 is obtained as the product N=Q×P of the fourth predetermined mirror ratio Q and the fifth predetermined mirror ratio P.

This can be done as follows. In the case of the first output transistor circuit 40-1, there is provided a third mirror source transistor in the form of a PNP transistor Q45b connected between the power supply Vdd and the current output instruction signal vii. The first output transistor circuit 40-1 is also provided with a PNP transistor Q46b having an emitter connected to the base of the PNP transistor Q45b, a base connected to the collector of the PNP transistor Q45b, and a collector connected to the ground, and a resistor R42b connected between the base of the PNP transistor Q45b and the power supply voltage Vcc.

In this arrangement, the current output instruction signal vii flows via the PNP transistor Q45b. A third mirror source voltage proportional to the current output instruction signal vii is generated at the base of the PNP transistor Q45b. In response to the third mirror source voltage, a third mirror current Q*vii that is Q times the current output instruction signal vii flows through the PNP transistor Q47b serving as the third mirror target transistor, where Q is the fourth predetermined mirror ratio. This third mirror current Q*vii flows through a current mirror circuit that consists of an NPN transistor Q48b and an output transistor in the form of an NPN transistor Q49b having a fifth predetermined mirror ratio P. Thus, a load current Iout of vii*Q*P is fed to the load 70. Each of the second through fourth output transistor circuit 40-2-40-4 operate in the same manner.

It will be understood that, by choosing the mirror ratios Q and P such that P×Q=N, the number of the transistors used and/or the area occupied by the respective transistor can be reduced. This is useful especially when the mirror ratio N must be large as shown in FIG. 1. Thus, an overall chip area can be minimized. For example, for N=100, the same current mirror ratio can be attained by choosing Q=10 and P=10.

Although the invention has been described above with reference to the embodiments using bipolar transistors, it should be understood that field effect type transistors such as MOSFETs can be used equally well in constructing a differential current output unit of the invention.

What we claim is:

1. A differential current output unit, comprising:
   a difference input circuit that includes first and second current mirror source transistors for respectively outputting a first and a second mirror source voltage in response to a differential input voltage inputted to said difference input circuit;
   a current subtraction circuit for outputting current in accordance with the difference in current between
      a first mirror current outputted from a first transistor first mirror target transistor in response to said first mirror source voltage and
      a second mirror current outputted from a second transistor second mirror target transistor in response to said second mirror source voltage;
   a delivery circuit for generating and delivering current output instruction signals in accordance with the magnitude and polarity of said difference current; and
   a current output circuit having a plurality of output transistor circuits each including
      a third mirror source transistor that is enabled by one of said current output instruction signals and
      a third mirror target transistor for flowing therethrough current in accordance with the current that flows through said third mirror source transistor, wherein said current output circuit is adapted to provide a load with positive or negative output current in accordance with the polarity and magnitude of said current output instruction signals.

2. The differential current output unit according to claim 1, wherein said delivery circuit includes first and second delivery transistor circuits for respectively outputting a current output instruction signal that is controlled in accordance with said difference current when said difference current has negative polarity, and third and fourth delivery transistor circuits for respectively outputting a current output instruction signal that is controlled in accordance with said difference current when said difference current has positive polarity;

said current output circuit includes a first output transistor circuit for flowing therethrough an output current in response to a first current output instruction signal received from said first delivery transistor circuit, a second output transistor circuit for flowing therethrough an output current in response to a second current output instruction signal received from said second delivery transistor circuit, a third output transistor circuit for flowing therethrough an output current in response to a third current output instruction signal received from said third delivery transistor circuit, and a fourth output transistor circuit for flowing therethrough an output current in response to a fourth current output instruction signal received from said fourth delivery transistor circuit; and said current output circuit is adapted to establish a first load current path for flowing the output current of said first output transistor circuit to an external load and flowing the output current of said second transistor circuit from said external load, and a second load current path, opposite in direction with respect to said first load current path, for flowing the output current of said third output transistor circuit to said external load and flowing the output current of said fourth output transistor circuit from said external load.

3. The differential current output unit according to claim 2, wherein each of said first through fourth output transistor circuits includes a mirror source transistor controlled by respective current output instruction signals received from said delivery circuit, and a mirror target transistor for flowing therethrough a current that is N times the current flowing through said mirror source transistor, where N is said second predetermined mirror ratio.

4. The differential current output unit according to claim 2, wherein each of said first and third output transistor circuits includes a mirror source transistor controlled by respective current output instruction signals received from said delivery circuit and a mirror target transistor for flowing therethrough a current that is N times the current flowing through said mirror source transistor; and each of said second and fourth output transistor circuits includes a mirror source transistor controlled by respective current output instruction signals received from said delivery circuit and a mirror target transistor for flowing therethrough a current that is N×α times the current flowing through said mirror source transistor, wherein N×α is a third mirror ratio with N being said second mirror ratio and α being an arbitrary number other than 1.

5. The differential current output unit according to claim 2, wherein each of said first through fourth output transistor circuits includes a first current mirror circuit having a fourth predetermined minor ratio Q and controlled by a respective current output instruction signal received from said delivery circuit, and a second current mirror circuit having a fifth predetermined mirror ratio P and controlled by the output current of said first current mirror circuit.

6. The differential current output unit according to claim 1, wherein said current subtraction circuit has said first mirror target transistor serially connected at a node to a first constant current source for supplying a first constant current so as to output a first difference current from said node in accordance with said difference current, and said second mirror target transistor serially connected at a node to a second constant current source for supplying the first constant current so as to output a second difference current of opposite polarity with respect to said first difference current from the node of these transistors.

* * * * *